United States Patent
Gedge et al.

(10) Patent No.: US 10,277,272 B2
(45) Date of Patent: *Apr. 30, 2019

(54) LINE FAULT CLASSIFICATION

(71) Applicant: BRITISH TELCOMMUNICATIONS PUBLIC LIMITED COMPANY, London (GB)

(72) Inventors: Richard Gedge, London (GB); Simon Barnett, London (GB)

(73) Assignee: BRITISH TELECOMMUNICATIONS public limited company, London (GB)

( * ) Notice: Subject to any disclaimer, the term of this patent is extended or adjusted under 35 U.S.C. 154(b) by 29 days.

This patent is subject to a terminal disclaimer.

(21) Appl. No.: 15/514,837

(22) PCT Filed: Sep. 16, 2015

(86) PCT No.: PCT/EP2015/071255
§ 371 (c)(1),
(2) Date: Mar. 28, 2017

(87) PCT Pub. No.: WO2016/050518
PCT Pub. Date: Apr. 7, 2016

(65) Prior Publication Data
US 2018/0234131 A1 Aug. 16, 2018

(30) Foreign Application Priority Data
Sep. 30, 2014 (EP) ..................................... 14250113

(51) Int. Cl.
*H04B 3/46* (2015.01)
*H04M 3/08* (2006.01)
(Continued)

(52) U.S. Cl.
CPC ............. *H04B 3/46* (2013.01); *H04L 12/437* (2013.01); *H04M 3/08* (2013.01); *H04M 3/306* (2013.01);
(Continued)

(58) Field of Classification Search
CPC . H02H 3/335; H02H 3/16; H04B 3/46; H04L 12/437; H04M 3/08; H04M 3/306; H04M 2201/18; G01R 31/085
See application file for complete search history.

(56) References Cited

U.S. PATENT DOCUMENTS

| 9,998,590 B2 * | 6/2018 | Gedge | H04M 3/10 |
| 2003/0107999 A1 * | 6/2003 | Peleg | H04L 12/5602 370/252 |
| 2013/0010931 A1 * | 1/2013 | Berg | H04B 3/487 379/22 |

FOREIGN PATENT DOCUMENTS

| CN | 101 674 106 | 3/2010 |
| EP | 1 349 355 | 10/2003 |
| WO | WO 2013/154579 | 10/2013 |

OTHER PUBLICATIONS

International Search Report for PCT/EP2015/071255 dated Dec. 8, 2015, 3 pages.

* cited by examiner

*Primary Examiner* — Sun S Ahn
(74) *Attorney, Agent, or Firm* — Nixon & Vanderhye P.C.

(57) ABSTRACT

This invention relates to a method of managing a digital subscriber line, where classification for a potential fault on a line is generated. The invention continuously measures the signal to noise (SNR) margin on the DSL line, and compares the measurements to predetermined conditions based on SNR margin characteristics associated with a population of good lines. Once the SNR margin measurements fail to meet (Continued)

the predetermined conditions, the line is flagged as experiencing a potential fault. Further measurements from weather sensors are gathered, and correlated with the SNR margin characteristics. The resulting correlation is used to generate a classification of a potential fault on the line. This can then be used to more specifically direct diagnosis and further testing.

5 Claims, 8 Drawing Sheets

(51) Int. Cl.
    *H04M 3/30*     (2006.01)
    *G01R 31/08*     (2006.01)
    *H04L 12/437*     (2006.01)

(52) U.S. Cl.
    CPC ....... *G01R 31/085* (2013.01); *H04M 2201/18* (2013.01)

LINE FAULT CLASSIFICATION

This application is the U.S. national phase of International Application No. PCT/EP2015/071255 filed Sep. 16, 2015 which designated the U.S. and claims priority to EP Patent Application No. 14250113.9 filed Sep. 30, 2014, the entire contents of each of which are hereby incorporated by reference.

FIELD OF THE INVENTION

This invention relates to a method of managing a digital subscriber line, in particular to classifying a fault on a digital subscriber line.

BACKGROUND TO THE INVENTION

Digital subscriber line (DSL) services, commonly referred to as "broadband" services, are deployed using metallic PSTN lines that run between a digital subscriber line access multiplexer (DSLAM) and modems in subscribers' properties. With asymmetric DSL (ADSL) the DSLAM is located in the exchange and the line can be typically up to 7 km in length. With very-high bit-rate DSL (VDSL), the DSLAM is located in a local cabinet with the line being much shorter, typically a maximum of 2 km. The line is normally made up of a twisted copper pair, but can include lengths of aluminium.

Faults on DSL lines are not uncommon, and currently most faults are found by customers reporting problems such as their line being noisy, having slower than expected broadband speed, or even interrupted broadband service. Troubleshooting a fault often includes performing line tests on the line. Line tests can also be performed proactively to identify faults before a customer reports them. These line tests are typically electrical line tests that measure the electrical characteristics of a line and check that the results meet a standard (for example, as set out in SIN349 by British Telecommunications plc). It is also possible to compare line tests over a period of time to see if the line's electrical characteristics are deteriorating. Once a fault has been detected, an engineer can use electrical line testing, typically pair quality tests, to try and determine where the fault is located and make the appropriate repairs.

However, there are a range of fault conditions which are not picked up by this process. This can be due to the faults being intermittent or not severe enough to be measureable using existing techniques. Intermittent faults are particularly problematic to find but can cause great disruption to broadband services where a line drop can result in a service outage whilst the line retrains.

Furthermore, the deployment of PSTN lines requires joints to be made to join together different sections of cable. Joints are weather sealed, typically using a combination of gel filled crimp connectors and/or physical enclosures such as joint boxes, manholes and cabinets, and insulated from each other. However, weather sealing can fail allowing moisture into joints causing corrosion or conductivity between pairs, commonly known as a wet joint. Insulation can also be damaged by being abraded against physical objects such as trees, resulting in moisture affecting the line.

International patent application WO2013/154579 describes various diagnostic methods for telephone lines. Patterns of line data are used, and observed data distributions are classified using modelled distributions previously determined to correspond to known line activity, fault type, or fault location.

"Management of a DSL copper network using built-up qualification tools" by Martin Nilsson, Master's Degree Project, Stockholm 2005, provides an overview of DSL systems, and introduces concepts for regular monitoring measurements on a line performed periodically. The data is collected in a database for further analysis. A toolbox of programs are described to put the concepts into action.

SUMMARY OF THE INVENTION

According to one aspect of the present invention, there is provided a method of managing a digital subscriber line in a telecommunications network, comprising:
  measuring a signal to noise ratio parameter associated with the digital subscriber line;
  identifying variations in the signal to noise ratio parameter;
  measuring a plurality of weather parameters associated with the digital subscriber line;
  comparing the signal to noise ratio parameter with one or more predetermined conditions, wherein the predetermined conditions are based on signal to noise ratio parameter characteristics associated with a population of lines operating without a fault; and if one or more of the predetermined conditions are not met, then
  determining a correlation between the variations in the signal to noise ratio parameter and each of the plurality of weather parameters;
  generating a fault classification for the line in dependence on the correlation.

The steps of the method may be performed repeatedly to generate a plurality of fault classifications for the line over a period of time.

Determining a correlation may comprise comparing each of the plurality of weather parameters with a respective predetermined threshold or thresholds.

The method may further comprise allocating a specific test to the line in dependence on the fault classification.

The signal to noise ratio parameter may be the signal to noise ratio margin.

BRIEF DESCRIPTION OF THE DRAWINGS

For a better understanding of the present invention reference will now be made by way of example only to the accompanying drawings, in which.

DESCRIPTION OF PREFERRED EMBODIMENTS

The present invention is described herein with reference to particular examples. The invention is not, however, limited to such examples.

This invention relates to a method of managing a digital subscriber line, where classification for a potential fault on a line is generated. The invention continuously measures the signal to noise (SNR) margin on the DSL line, and compares the measurements to predetermined conditions based on SNR margin characteristics associated with a population of good lines. Once the SNR margin measurements fail to meet the predetermined conditions, the line is flagged as experiencing a potential fault. Further measurements from weather sensors are gathered, and correlated with the SNR margin characteristics. The resulting correlation is used to generate a more refined classification of a potential fault on the line. This can then be used to more specifically direct diagnosis and further testing.

Figure 1:
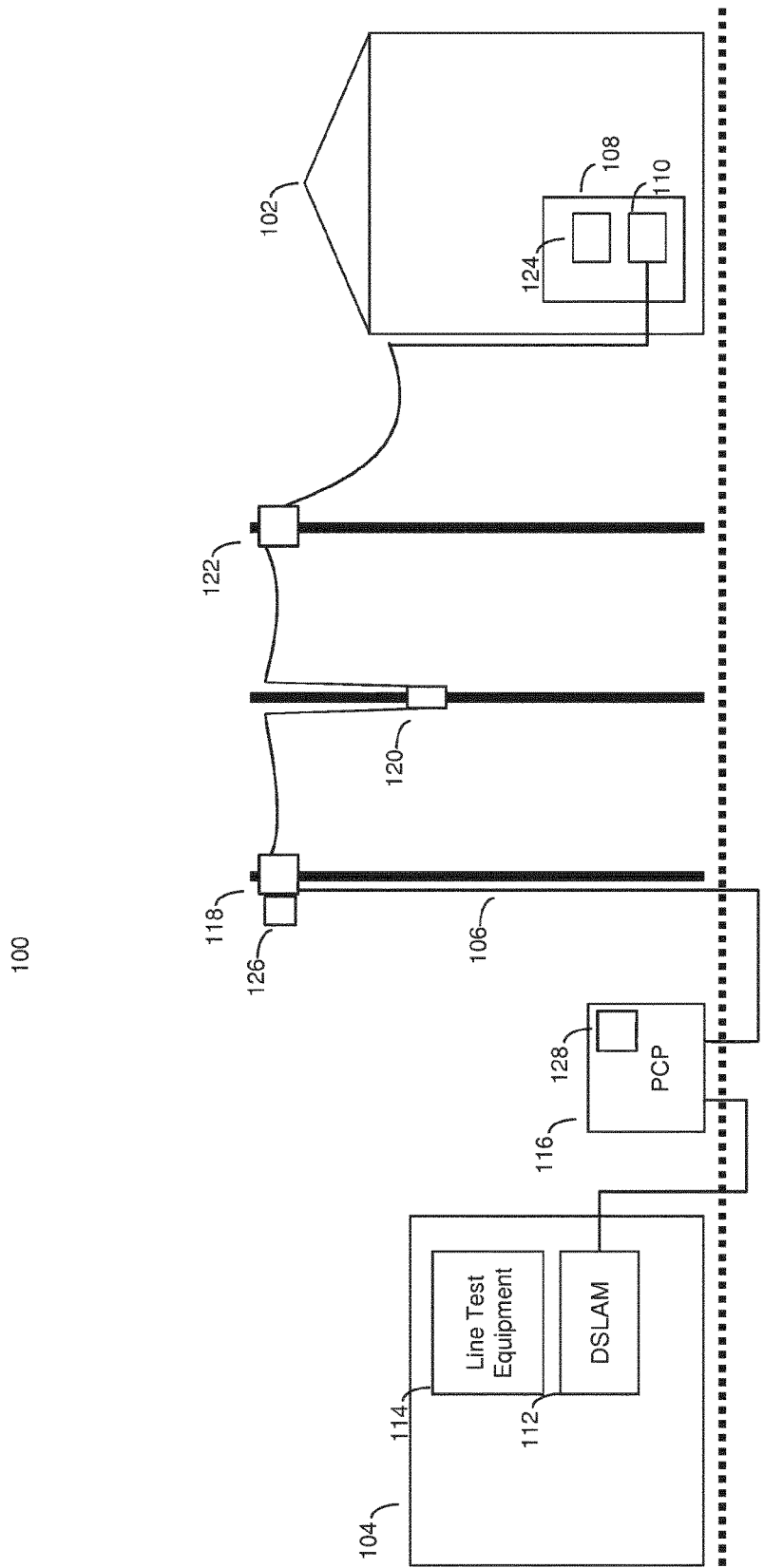
FIG. 1 is a system diagram showing a telephone exchange and a DSL line running to a customer premises.

FIG. 1 illustrates a simplified diagram of an asymmetric digital subscriber line (ADSL) network 100. Some elements have been omitted for simplicity, and conversely in some practical deployments, some elements shown are not required.

The network 100 including a customer's premises 102 connected to a telephone exchange 104 via a telephone line 106. The telephone line 106 is a twisted metallic pair made of copper or aluminium. Within the customer premises 102, there is a customer premises equipment CPE 108, such as a router or residential gateway, and comprises a DSL modem 110. At the exchange 104, the line 106 is connected to a digital subscriber line access multiplexer DSLAM 112. The DSLAM 112 is a network element that provides DSL services to connected lines and associated customer premises. The line 106 is thus also referred to as a digital subscriber line, or DSL line, though it will be appreciated that the line can also provide PSTN services. The exchange also houses electrical line test equipment 114, which can be connected to the line 106 by way of switching equipment in the exchange 104. Switching over to the test equipment 114 will disconnect the line from the DSLAM and thus disconnect the line from DSL services. The electrical line test equipment can measure various parameters associated with the line, including resistances, DC voltages, and capacitance.

Between the exchange 104 and the CPE 108, the line 106 passes through a number of connection points. The line 106 leaves the exchange and first passes through a Primary Cross-connection Point (PCP) 116, commonly referred to as a street cabinet, after it leaves the exchange 104. The cabling between the exchange 104 and the PCP 116 is largely to be found underground. The line 106 then goes overhead to a joint box 118 mounted on the top of a pole. The line continues to another pole and is jointed in another box 120 further down the pole. The line continues from there to yet another pole to an aerial Distribution Point (DP) 122. From the DP 122, the line 106 takes the form of an overhead drop wire, which terminates at the customer premises 102 at a network termination equipment (NTE) and onto the CPE 108 and modem 110.

Whilst only one line 106 and customer premises 102 are shown in FIG. 1, it will be appreciated that the network 100 will include other lines and associated customer premises, which have been omitted for simplicity. Each connection point will have many lines passing through it, with the PCP 116 having the most, and the DP 122 having the fewest, as lines get routed to alternative destinations.

Each connection point can be considered as a node or junction, as the line 106 is in practice made up of multiple sections of cable, and the joins between cable sections housed in the connection points.

The CPE 108 further includes a control module 124. The control module 124 gathers various parameters and measurements associated with the line 106 via the modem 110, and processes them in accordance with the invention as described below. The control module 124 may be implemented as a software module incorporated into the firmware of the CPE 108.

Two sensors 126 and 128 are also shown. These are weather related sensors (such as relative humidity, rain, or leaf wetness), and will be described in more detail later. Sensor 126 is located at the site of the joint box 118, and sensor 128 at the PCP 116. Whilst only two sensors are shown here, more sensors can be used, and positioned elsewhere in the network 100. The locations of the sensors are preferably at one or more points along the line 106 that are most likely to experience weather impact, in particular moisture ingress. This is most likely to occur at junctions between sections of the cable that make up the line 106, for example in the PCP 116 or the joint box 118. Sensors could additionally or alternatively be placed at other distribution points (DPs) along the line. Furthermore, each sensor can be located externally or internally at the respective DP.

Whilst the present example shows a DSLAM 112 residing in the exchange 104, the invention would still be applicable to configurations where the DSLAM is located elsewhere. For example, in a fibre to the cabinet (FTTC) arrangement, the DSLAM 112 might be located in the PCP 116, an example of which is a roadside cabinet, which is typically located nearer the customer premises than the exchange.

In an alternative network arrangement, DSLAM like functionality can be provided by an MSAN (multi services access node), which also provides other capabilities such as voice. The DSLAM and MSAN are both examples of aggregation transceiver devices, which effectively aggregate a number of DSL lines, terminating them at a plurality of modems housed within.

An example of the present invention will now be described with reference to the flow chart of FIG. 2.

Processing starts at step 200, with the modem 110 measuring the SNR margin associated with the line 106. The SNR margin is the difference between the measured SNR and the SNR required to operate the line at a specific synchronisation rate, where the measured SNR is an instantaneous measure of the ratio of the received wanted DSL signal power to unwanted interference signals or noise. For example, if the line is synchronised at 8 Mbs and needs 35 dB of SNR to operate at this rate, and the measured SNR is 41 dB, then the SNR margin would be 6 dB.

The SNR margin is monitored every 60 seconds over 24 hour cycles, and the results are gathered by the control module 124, which stores them for processing. The SNR margin measurements can be gathered more or less frequently depending on the configuration of the modem 110 in the CPE. The downstream SNR margin is used here, as it is the service on the downstream channel that a customer notices most, rather than the upstream channel.

Figure 3:
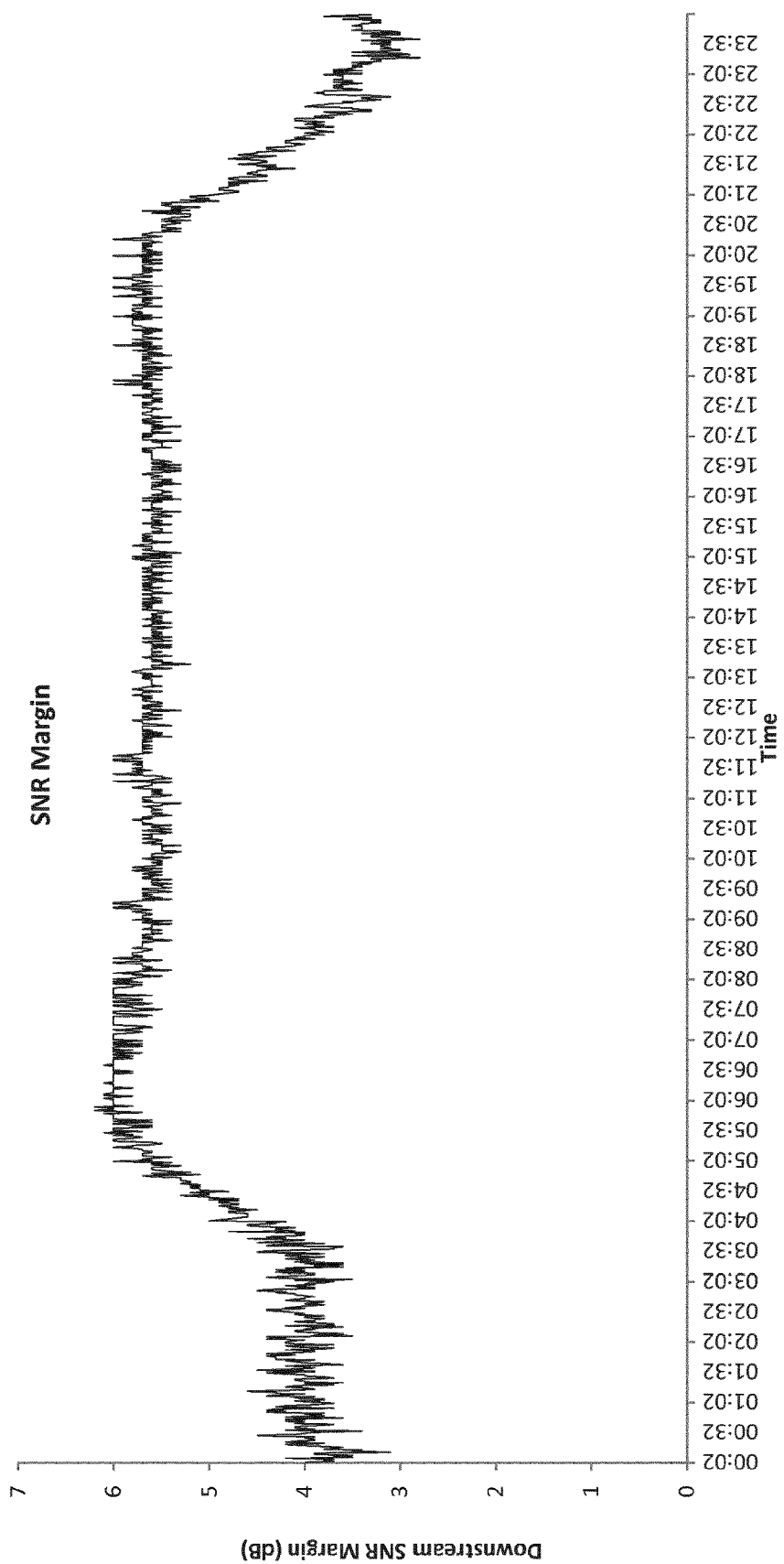
FIG. 3 is a graph showing the SNR margin for a good line over a 24 hour period.

FIG. 3 illustrates a graph of the (downstream) SNR margin over a 24 hour period for a line operating without any significant faults. The SNR margin exhibits a diurnal pattern (which is caused by radio interference increasing during the hours of darkness as a result of ionosphere effects) causing the SNR margin to drop between 8 pm and 5 am.

The SNR margins from a large population of good lines (i.e. lines considered to be fault free) are analysed in this way to determine SNR margin characteristics that are representative of the good lines. The SNR margin measurements can be taken over a number of days and averages taken, before being processed to identify the specific characteristics common to the good lines. In this example, the following characteristics are identified:
1. The daily SNR margin variation is around 3 dB
2. Maximum short term (5 minutes) SNR margin variation is around 0.5 dB
3. Maximum rate of change of SNR margin is around 0.5 dB per minute The first characteristic reflects the diurnal variation over the course of a 24 hour period. The second characteristic reflects the gradual change in SNR margin that can take place. The third characteristic maps the minute by minute variation, usually due to background noise.

These SNR margin characteristics are used to generate test conditions with associated thresholds. Other characteristics might be identified and used as well or instead. The SNR margin measurements from step 200 are compared against these test conditions. A line with measurements that do not meet at least one of the test conditions is considered not to be operating normally and to be exhibiting a potential fault, and therefore tested with an electrical line test. In this example, based on the above characteristics, the following test conditions and thresholds are set:
1. Daily SNR margin variation<=4 dB
2. Short term (5 minutes) SNR margin variation<=2 dB
3. Rate of change of SNR margin<=2 dB per minute In this example, these test conditions are generated in advance but can be adjusted and updated by the network operator as required, and may be based on further inputs. The test conditions and predetermined thresholds are stored by the control module 124, and used in step 202. Note the thresholds are set slightly above the observed characteristics to account for minor variations that are not indicative of a fault.

In step 202, the control module 124 compares the SNR margin measurements against the test conditions. This is done after each new SNR margin measurement is gathered from step 200, which in this example occurs every 60 seconds. Alternatively, a different period of time can be used between comparisons. However, the aim is to make the comparison using the current or most recent SNR margin measurements.

In step 204, if the measurements from the line 106 do pass all of the test conditions, then processing passes back to step 200, where the SNR margin continues to be monitored and analysed. If the measurements fail any one of the test conditions, then processing passes to step 206, as the line is deemed to be suffering from a potential fault.

Figure 4:
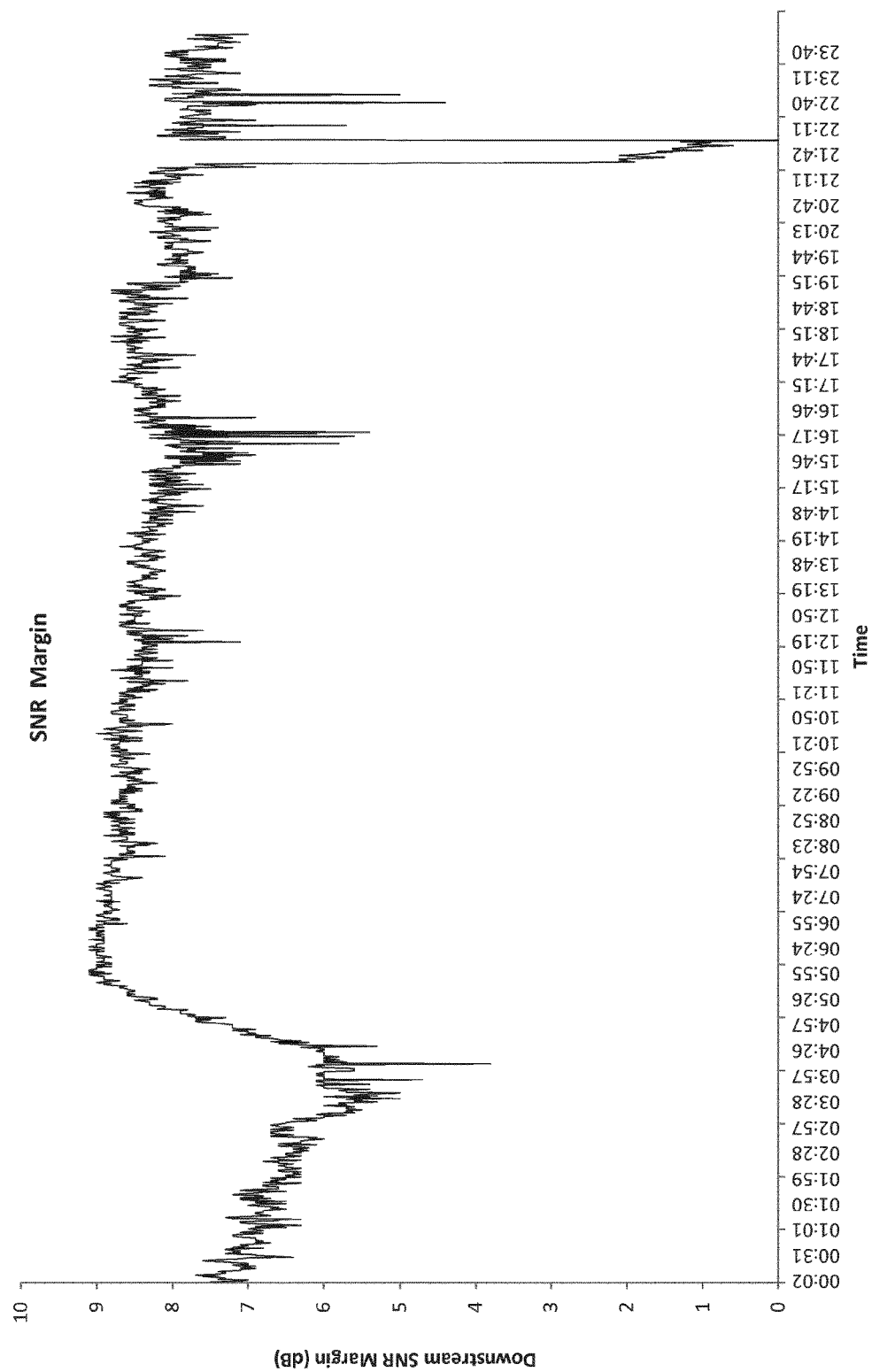
FIG. 4 is a graph showing the SNR margin for a potentially faulty line over a 24 hour period.

FIG. 4 shows graphs of SNR margin measurements for an example line that fails to meet the test conditions. FIG. 4 plots the (downstream) SNR margin reported every 60 seconds. Thus, the SNR margin characteristics of this line deviates from the target in a number of ways:
1. At 04:11 the SNR margin drops by just over 2 dB in a minute.
2. Around 16:00, there are several variations in the SNR margin of just over 2 dB in a minute.
3. At 21:30 the SNR margin drops by 6 dB in 1 minute.
4. The SNR margin continues to fall until at 10 pm it reaches 0 and causes a line re-sync, with periods where the short term SNR margin variation is also greater than 2 dB over 5 minutes.

Furthermore, the line actually re-syncs at a lower rate which is almost 1 Mbps lower than before but restores the SNR margin to the target 9 dB.

Thus, if testing on this line begins at 00:00 with step 200, the line would meet the test conditions during the first 4 hours or so, with the SNR margin on the line continuously being monitored and tested. Then at 04:11, as the SNR margin drops by over 2 dB in a minute, the test condition for the rate of change of the SNR margin being <=2 dB per minute will not be met. Hence processing would pass onto step 206.

The line would then meet the test conditions until around 16:00. At around 16:00, the SNR margin drops by over 2 dB in a minute, and so the same test condition for the rate of change per minute is not met, and processing would then pass onto step 206.

At 21:30, the test for the rate of change per minute of SNR margin is not met, and soon after the test for the short term (5 minutes) SNR margin variation is also not met. And thus processing would also pass to step 206 at this point.

So in step 204, if the measurements fail at least one of the test conditions, as shown at certain times in the example illustrated in FIG. 4, then a potential fault is occurring and processing passes to step 206. SNR margin measurements that do not meet the test conditions can be referred to as SNR perturbations. In this example, it is the variations in the SNR margin measurements over a given period of time that are compared against the test conditions, which themselves are characterised over a period of time.

In step 206, the control module 124 flags a fault for the line 106, and an electrical line test needs to be triggered immediately to capture the instant the line is experiencing problems. In practical systems it is not ideal to run line tests too frequently, hence a mechanism can be implemented to set a minimum time between the line tests, which the network operator can adjust as required. In this example, a timer is used (counting down from a pre-set value) by the control module 124 to achieve this, but other methods could be used to delay the line test by the minimum time from the previous line test. Thus, in step 208, the control module 124 determines if the minimum time between tests has elapsed. If it has, then processing passes directly to step 210 to trigger an electrical line test. If the minimum time has not elapsed, then the control module 124 waits until the minimum time has elapsed (step 209) before passing to step 210.

In step 210, an electrical line test is triggered. This can be done by the control unit 124 using an API running on a server on the network, which in turn can trigger the line test equipment 114. Alternatively, the control unit 124 can be configured to directly instruct the line test equipment 114 to perform the line test. The electrical line tests measure various parameters associated with the line, such as DC voltage A to earth, DC voltage B to earth, DC voltage A to B, capacitance A to earth, capacitance B to earth, capacitance A to B, resistance A to earth, and so on.

The results are analysed in step 212. Some faults can be identified directly from analysis of parameters from the line test (using ranges and threshold values associated with known faults for example), though the specifics of this analysis and identification are not discussed here. Otherwise, other activities can be performed. For example, further fault events can be captured using the above method over a period of time, to build up a more detailed picture, which may result in improved diagnosis and an assessment on the impact to the DSL service of the fault level of service interruption. Alternatively, the fault event can be correlated with other information. Processing cycles back to step 200 after the line test is triggered in step 210.

The pseudocode below sets out in a simplified manner how the test conditions described above might be implemented:

IF max($SNR_{t1-t1440}$)−min($SNR_{t1-t1440}$)>4 OR
|($SNR_t$−$SNR_{t-5}$)|>2 OR
|($SNR_t$−$SNR_{t-1}$)|>2
THEN SET TRIGGER_TEST=TRUE max($SNR_{t1-t1440}$)−min($SNR_{t1-t1440}$) tests for the diurnal variation characteristic, |($SNR_t$,$SNR_{t-5}$)|>2 for the short term (5 mins) SNR variation characteristic, and |($SNR_t$−$SNR_{t-1}$)|>2 for the per minute SNR margin variation characteristics.

The act of correlating with other information forms the basis of an improvement to the line testing method described above—weather optimised line test triggering.

Atmospheric conditions can affect the operation of a DSL line. However, weather is dynamic and it is not always obvious that intermittent faults are being caused by weather. To assess whether a fault is correlated to the weather it is necessary to have nearby weather data available, the spatial distance and sample frequency will directly affect the correlation results.

The network 100 in FIG. 1 shows two sensors 126 and 128. These are used to assess the atmospheric moisture or wetness levels, as one particular problem that is encountered is water ingress on a line. Examples of the types of sensors that can be used include:

1. Relative Humidity Sensor: This measures relative humidity. When at 100%, the air is fully saturated and it is possible that water may condense to form a mist/fog but is dependent on other factors such as wind.
2. Rain Sensor: A measure of rain falling over a period of time.
3. Dew point: not a sensor as such, but a parameter based on known relationship a between temperature, relative humidity, and barometric pressure. If the temperature approaches the dew point then it is likely that water will condense on cold objects
4. Leaf Wetness: Found to be the best single sensor in studies. Usually deployed in the agricultural industry, see http://en.wikipedia.org/wiki/Leaf wetness, a leaf wetness sensor measures the amount of dew or precipitation on a surface. A typical leaf wetness sensor operates by measuring the change in electrical resistance between two metal conductors in an alternate finger configuration on a flat surface. Tests have found that a leaf wetness sensor provides a good indication of the moisture on PSTN and DSL circuits.

The improved approach looks to correlate the atmospheric moisture levels, measured by one (or more) of sensors, with the SNR margin measurements on the line. If there is a correlation between the moisture levels and the SNR margin measurements, then the line is classified as having a weather related fault. A line test is triggered at a time when the SNR measurements fail to meet the test conditions described above, and whilst there is a correlation with the measured atmospheric moisture levels. The results of the line test in such a situation, together with the knowledge that the line may be experiencing a weather related fault, can lead to more focussed and accurate fault diagnosis.

The specific steps of operation of this improved method will now be described with reference to FIG. 5. The improved method is based on the main method described above, and summarised in FIG. 2, but includes some additional features that take into account an atmospheric moisture measure.

Starting at step 500, the SNR margin measurement associated with the line 106 is gathered by the control module 124 from the modem 110. An atmospheric moisture measure is also collected from one of the sensors 126 and 128. Several sensors can be used, and the measurements averaged. In this example, a leaf wetness sensor is used, with the resulting leaf wetness measurements calibrated from 0 to 15, with 0 indicating dry and 15 indicated 100% saturated or wet. The leaf wetness measurements are gathered and stored by the control module 124.

In step 502, the resulting SNR margin measurements are analysed and compared by the control module 124 against the test conditions. The test conditions used in this example are the same as those described above. Also as before, the comparison is done after each new SNR margin measurement is gathered from step 500, which in this example occurs every 60 seconds, though other intervals can be used.

In step 504, if the SNR margin measurements from the line 106 do meet the test conditions, then processing passes back to step 500, where the SNR margin continues to be monitored and analysed every 60 seconds. Again, in this example, it is really the variations in the SNR margin measurements over a given period of time that are compared against the test conditions, which themselves are characterised over a period of time.

If the SNR measurements from the line 106 do not meet the test conditions, then a potential fault might be occurring and processing passes to step 505 to determine whether there is a correlation between the SNR variations and the leaf wetness measurements.

In step 505, the moisture level measurements given by the leaf wetness sensors are analysed. The test is to see if the atmospheric moisture levels meet a certain threshold level—in this example, the threshold is set to the atmospheric moisture levels being high, at 100% saturation, or when leaf wetness measure of 15. Alternatively, the threshold could simply be set to anything non-zero/not dry. In this example, if the moisture levels are high (i.e. leaf wetness is at 15), then the line is classified as having a wet joint fault, and a line test should be triggered by moving to step 506. Otherwise processing passes back to step 500, and monitoring and analysis continue at regular intervals. Furthermore, the triggering of the line test should only occur whilst the line is experiencing a period of wetness (set at 100% saturation in this example) as identified by the leaf wetness measure.

In step 506, the control module 124 flags a wet joint fault for the line 106, and an electrical line test is triggered immediately to capture the instant the line is experiencing problems. However, and as described above, it is not ideal to run a line tests too frequently. Thus, in step 508, the control module 124 determines if the minimum time between tests has elapsed (see step 208), and if it has, then processing passes directly to step 510 to trigger an electrical line test. If the minimum time has not elapsed, then the control module 124 waits until the minimum time has elapsed (step 509) before passing to step 510.

Figure 2:
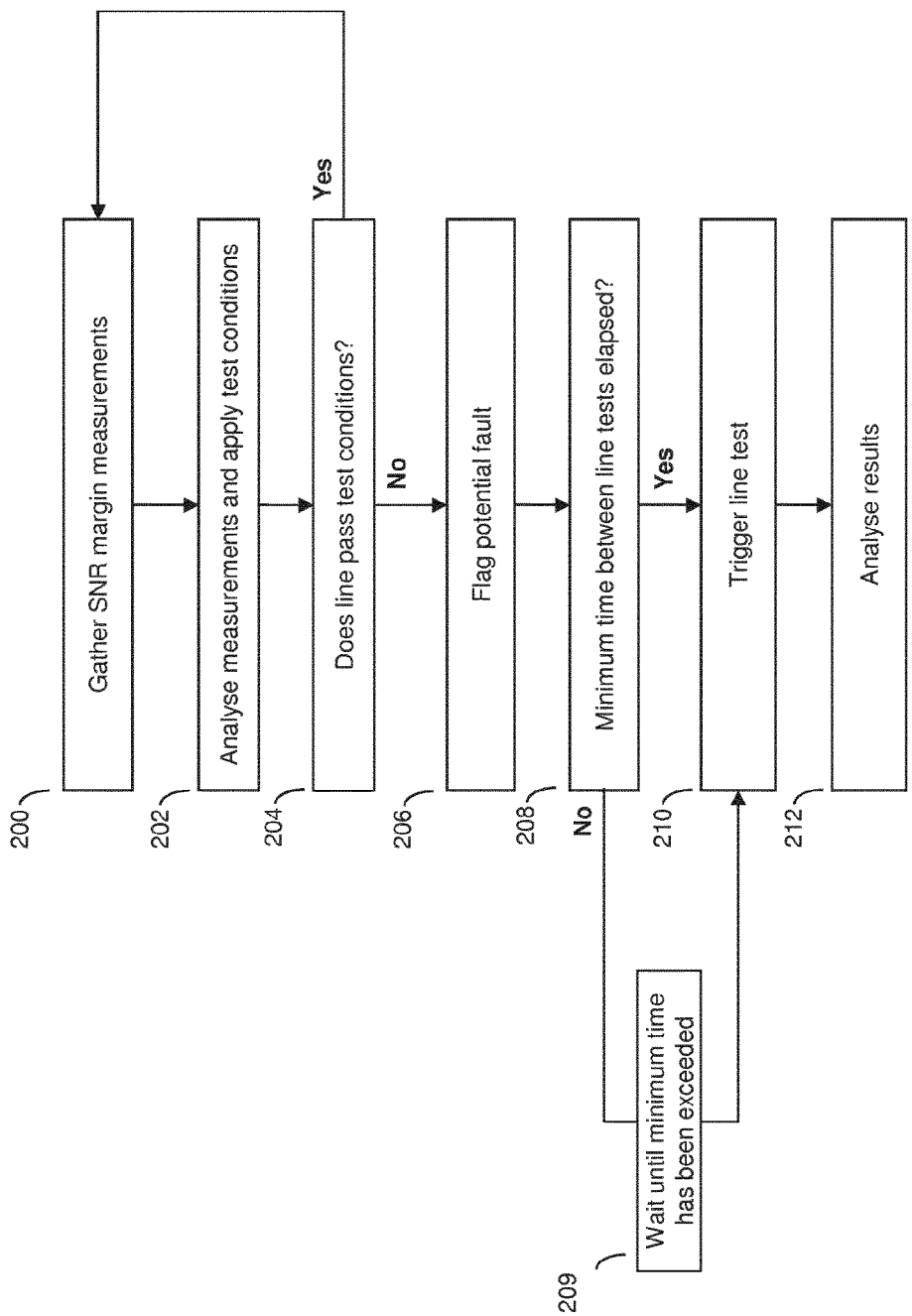
FIG. 2 is a flow chart illustrating the steps of an example of the invention.

The line test triggered in step 510 and subsequent analysis in step 512 is as per steps 210 and 212 respectively of FIG. 2.

Figure 6A:
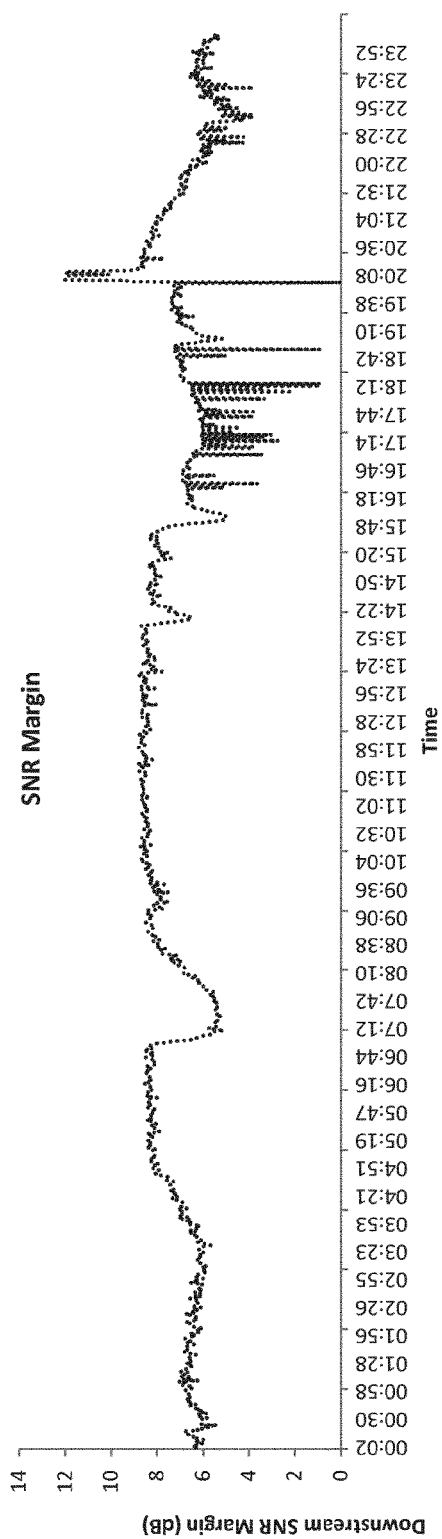
FIG. 6a is a graph showing the SNR margin over a 24 hour period for an example line.
Figure 6B:
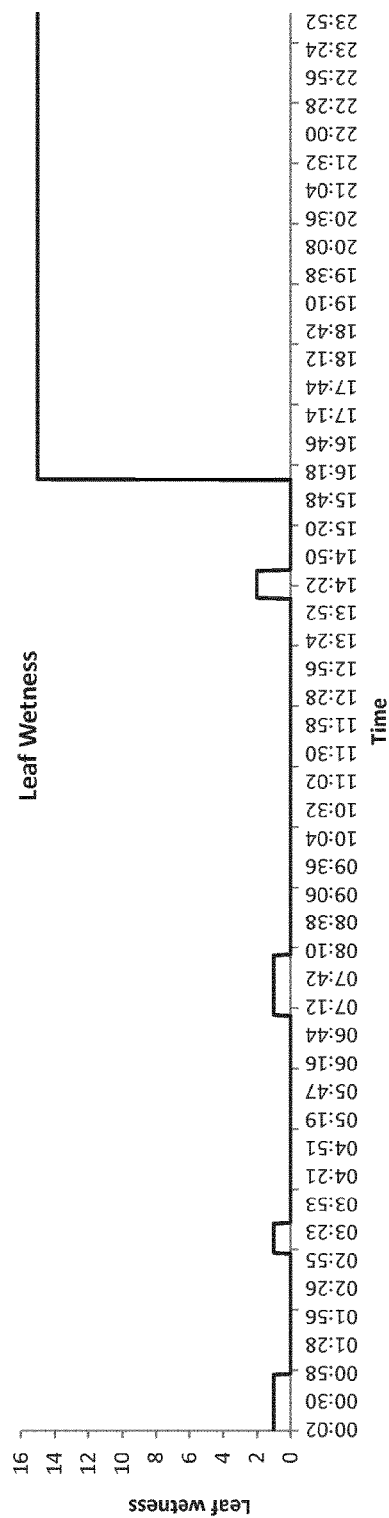
FIG. 6b is a graph showing the leaf wetness levels over a 24 hour period for an example line.

There now follows a worked example. FIG. 6a shows a graph of SNR margin measurements over a 24 hour period for an example line, and FIG. 6b the leaf wetness measurements for the same line. It can be seen from FIG. 6a, that the SNR margin drops a little at around 07:00, when there is also a marginal leaf wetness measure. Then starting around 16:30, the SNR margin varies significantly, dropping progressively lower until 20:00 when the line resynchronises to a lower rate. The leaf wetness measure from around 16:30 moves from dry (0) to saturated (15) very quickly.

Figure 5:
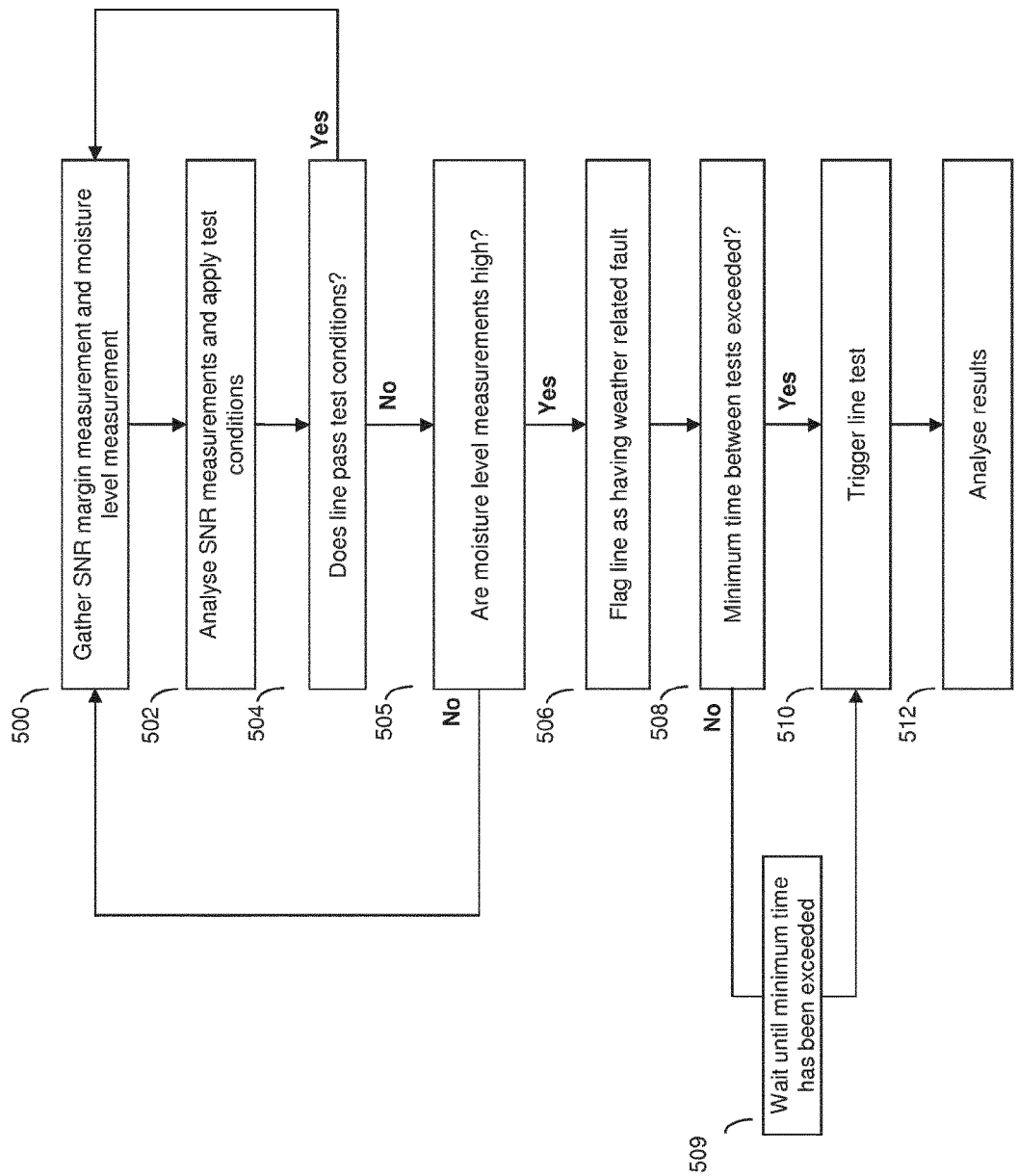
FIG. 5 is a flow chart illustrating the steps of a further example of the present invention.

Applying the method described in FIG. 5 starting at 00:00, there is an initial period up to around 07:00, where the SNR margin measurements meet the test conditions, and thus steps 500 to 504 are repeated, with the SNR measurements being continuously monitored. Then at around 07:00, the SNR measurements gathered will just fail to meet the test conditions at step 504, as the short term SNR margin variation is slightly more than 2 dB over a 5 minute period, and processing would pass to step 505. However, at this stage, the leaf wetness is only at 1, and so the moisture levels are not high enough to pass the test in step 505. Thus, no line test is triggered, and instead processing passes back to step 500, and the line continues to be monitored. Then when we arrive at around 16:30, the SNR variations are significant enough that the test conditions in step 504 are not met again. However, this time the moisture levels are high, with the leaf wetness sensor returning 15. Thus, processing passes to step 506, with the line flagged as experiencing a wet joint fault, and a line test triggered. After this point, the SNR margin variations remain significant for the next 4 hours or so, whilst the leaf wetness also remains high at 15, so line tests will be triggered regularly, at a rate capped by the minimum time between tests in step 508.

Note, in this example line in FIG. 6, applying the initial method of FIG. 2 that only takes into account SNR variations, a line test would have been triggered around 07:00, as well at 16:30 and after that. However, with the improved method of FIG. 5 that takes into account moisture level measurements, a line test is only trigger from 16:30. Thus, line testing is directed in a more controlled manner to when there is likely to be a weather related problem.

In a further improvement to the line testing method described above in relation to FIG. 5 using weather sensors, multiple sensors are used to generate a more refined classification of a potential fault on the line. This can then be used to more specifically direct diagnosis and further testing.

Figure 7:
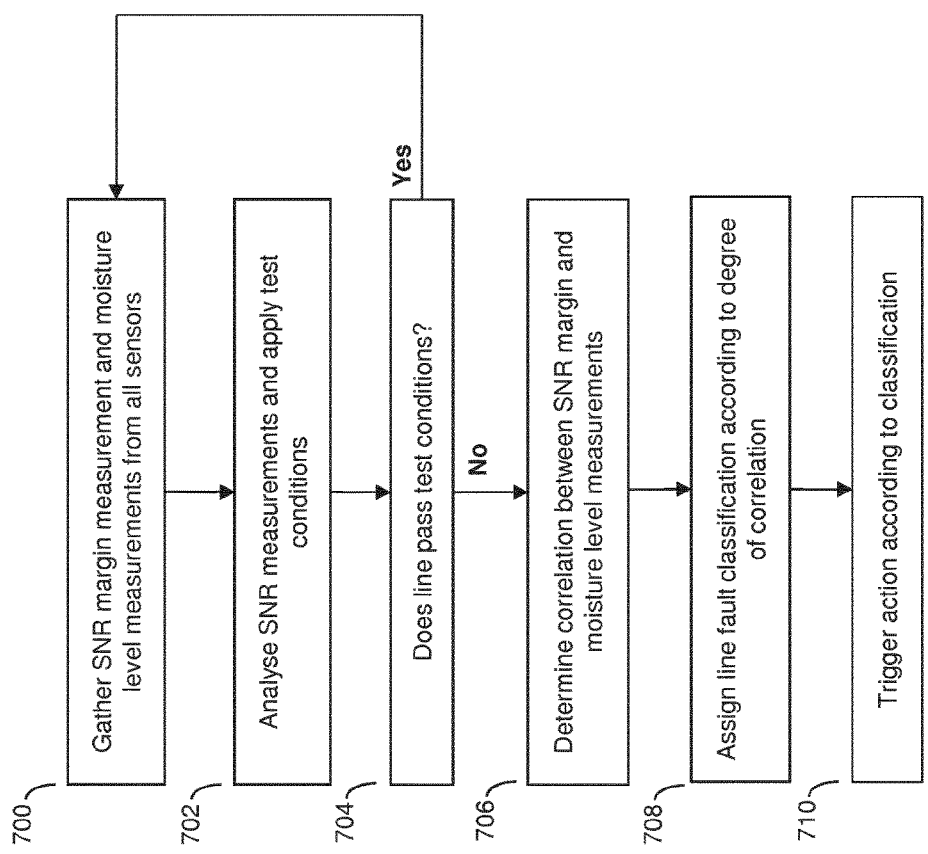
FIG. 7 is a flow chart illustrating the steps of another example of the present invention.

In this further improvement, a range of sensors are used. For example, both a leaf wetness sensor and a rain sensor (of the type described above) are used. The sensors are placed at the same point in the network somewhere along or near the line 106 (such as both at the PCP 116), or may be placed separately from each other (such as one at the PCP 116 and the other on the pole 118). FIG. 7 is a flow chart illustrating the steps of this further improved method. In step 700, the SNR margin measurements are gathered from the line 106, as well as measurements from these two sensors.

In step 702 (as in step 502), the resulting SNR margin measurements are analysed and compared by the control module 124 against the test conditions. In step 704 (as in step 504), if the SNR margin measurements from the line 106 do meet the test conditions, then processing passes back to step 700, where the SNR margin continues to be monitored and analysed repeatedly.

If the SNR measurements from the line 106 do not meet the test conditions, then a potential fault might be occurring and processing passes to step 706.

In step 706, the fault is assessed by determining the correlation, if any, between the SNR margin variations and the moisture level measurements. Using the resulting correlation results, a refined classification is generated for the fault. The correlation method is illustrated here with reference to an example line.

Figure 8A:
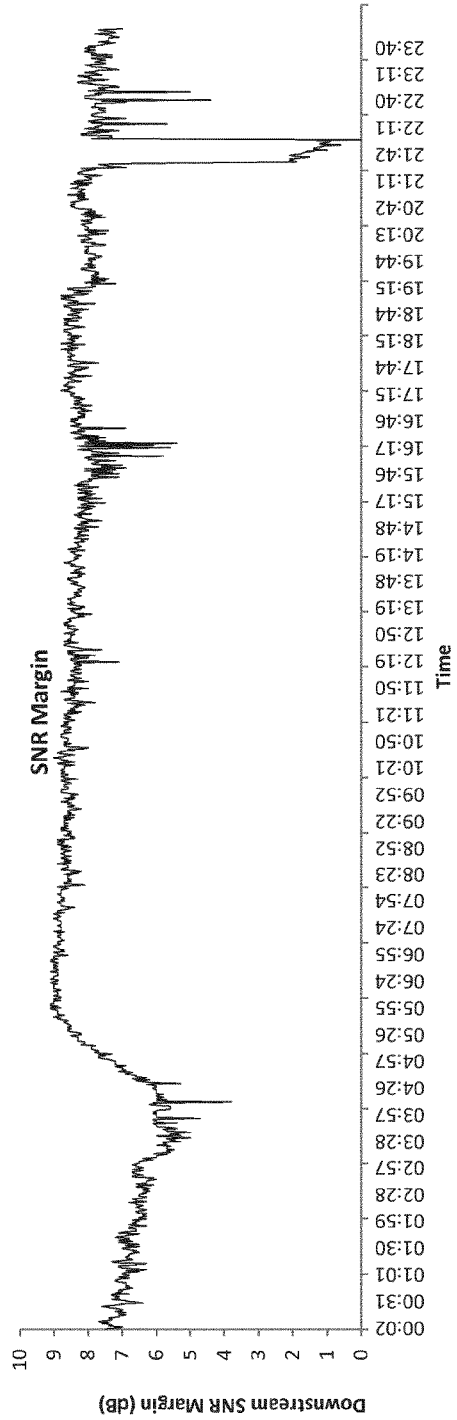
FIG. 8a is a graph showing the SNR margin over a 24 hour period for an example line.
Figure 8B:
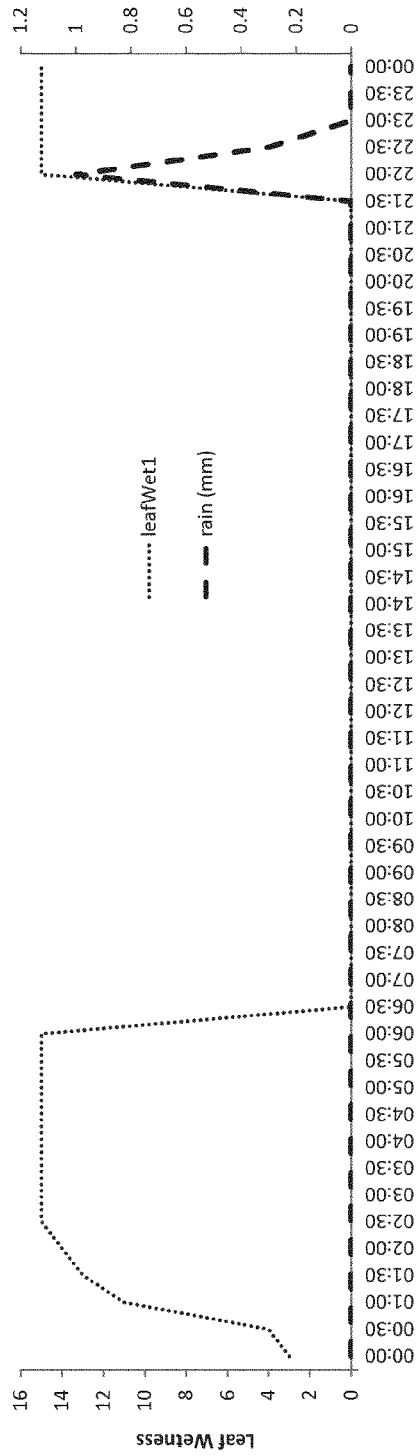
FIG. 8b is a graph showing the leaf wetness levels and rain levels over a 24 hour period for an example line.

FIG. 8*a* shows a graph of SNR margin over a 24 hour period for an example line, and FIG. 8*b* the moisture measurements for the line from the two sensors—leaf wetness levels and rain levels. In a first period between 00:00 and 06:30, the SNR margin shows minor variations, during which time the leaf wetness is also generally high. However, there is no rain measured during this period. In a second period at 21:00 to 22:00, the SNR margin shows a major variation and drops significantly, so much so that the DSL line actually resynchronises, during which time the leaf wetness levels are high, and the rain levels are also high during the same period.

Therefore, during the first period, it can be seen that there is a correlation between the SNR margin variations and the leaf wetness levels, but not the rain levels. The correlation can be determined in various ways. One approach is to examine the measurements from the weather sensors (when the SNR margin variations do not meet the test conditions), and comparing the measurements to thresholds or ranges. For example, the leaf wetness sensor measurements can have associated thresholds of =0 and >0 to represent dry (no correlation) and damp (correlation) respectively. The rain sensor measurements can have an associated thresholds=0 mm and >0 mm to represent dry (no correlation) and raining (correlation). Thus, using these thresholds for the first period, it is clear that there is only correlation with leaf wetness, but not rain. However, during the second period there is a correlation between both the leaf wetness levels and the rain levels.

The total correlation thus depends on the various measurements at a specific point in time. In this example, in the first period there is good correlation between the SNR margin variations and the leaf wetness levels, but in the second period there is good correlation between the SNR margin variations and both the leaf wetness levels and rain levels. The degree of correlation between the SNR margin variations and the number of moisture level measurements is used to classify the line in step 708.

In step 708, the line 106 can be assigned a line fault classification that reflects the correlation. One example of classifications is shown below:
1. Line has SNR perturbations only (Class 1)
2. Line has SNR perturbations and wetness correlation (Class 2)
3. Line has SNR perturbations, and wetness correlation and rain correlation (Class 3)

The method operates continuously by cycling back to step 700, and thus the generated line fault classification is updated continuously. Thus, the method will classify the line in FIG. 8 with a class 2 fault up to around 06:30, and then around 16:00 the line will be classified with a class 1 fault, as only SNR perturbations are measured, but between 21:00 and 22:00, the line will be classed with a class 3 fault.

Alternatively, each correlation (of say wetness or rain) can result in an individual correlation score of 1, and the final correlation (or classification) is the sum of the individual correlation scores. For example, if SNR perturbations do not correlate with any of the moisture level measurements, then the individual correlations scores are 0, and the final correlation is 0. But if just one of either of moisture level measurements result in correlation with the SNR perturbations, then a single individual correlation score of 1 results, so the final correlation is 1. If both moisture level measurements correlate with the SNR perturbations, then two individual correlation scores result, which will result in a final correlation of 2. This approach gives scope for further moisture level measures or sensors to be used (e.g. a dew-point sensor), with the possibility of higher degrees of final correlation.

The resulting classification can be used to trigger a suitable action in step 710. For example, electrical line tests as described earlier can be set to only trigger for faults that have a certain classification. More specific testing or further an engineer visit can be allocated to lines that have classifications based on high correlations, which might be more problematic or difficult to resolve.

Whilst the example described above focus on atmospheric moisture levels, other more general weather related measures could be used instead, such as wind speed, which could help ascertain whether driving rain is a factor, or if a line is rubbing against an object in high wind. Thresholds for wind speed can be set accordingly to determine correlation, such as corresponding to zero wind, low wind, and high wind.

Whilst the examples refer to SNR margin measurements, a person skilled in the art will appreciate that an absolute measure of the SNR associated with the line can be used instead an alternative indicator of the performance of the line.

Exemplary embodiments of the invention are realised, at least in part, by executable computer program code which may be embodied in an application program data. When such computer program code is loaded into the memory of a processor in the control module 124, it provides a computer program code structure which is capable of performing at least part of the methods in accordance with the above described exemplary embodiments of the invention.

A person skilled in the art will appreciate that the computer program structure referred can correspond to the flow chart shown in FIG. 2, where each step of the flow chart can correspond to at least one line of computer program code and that such, in combination with the processor in the control module 124, provides apparatus for effecting the described process. In a similar manner, computer program structure for the alternative methods can correspond to the flow charts shown in FIG. 5 or FIG. 7.

In general, it is noted herein that while the above describes examples of the invention, there are several variations and modifications which may be made to the described examples without departing from the scope of the present invention as defined in the appended claims. One skilled in the art will recognise modifications to the described examples.

The invention claimed is:

1. A method of managing a digital subscriber line in a telecommunications network, comprising:
   measuring a signal to noise ratio parameter associated with the digital subscriber line;
   identifying variations in the signal to noise ratio parameter;
   measuring a plurality of weather parameters associated with the digital subscriber line;
   comparing the signal to noise ratio parameter with one or more predetermined conditions, wherein the predetermined conditions are based on signal to noise ratio parameter characteristics associated with a population of lines operating without a fault; and if one or more of the predetermined conditions are not met, then
   determining a correlation between the variations in the signal to noise ratio parameter and each of the plurality of weather parameters;
   generating a fault classification for the line in dependence on the correlation.

2. A method according to claim 1, wherein the steps of the method are performed repeatedly to generate a plurality of fault classifications for the line over a period of time.

3. A method according to claim 1, wherein determining a correlation comprises comparing each of the plurality of weather parameters with a respective predetermined threshold or thresholds.

4. A method according to claim 1, wherein the method further comprises allocating specific testing to the line in dependence on the fault classification.

5. A method according to claim 1, wherein the signal to noise ratio parameter is the signal to noise ratio margin.

* * * * *